(12) United States Patent
Lee et al.

(10) Patent No.: US 8,987,802 B2
(45) Date of Patent: Mar. 24, 2015

(54) METHOD FOR USING NANOPARTICLES TO MAKE UNIFORM DISCRETE FLOATING GATE LAYER

(71) Applicant: SanDisk Technologies Inc., Plano, TX (US)

(72) Inventors: Donovan Lee, Santa Clara, CA (US); James Kai, Fremont, CA (US); Vinod Purayath, Santa Clara, CA (US); George Matamis, Danville, CA (US); Steven J. Radigan, Fremont, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/781,066

(22) Filed: Feb. 28, 2013

(65) Prior Publication Data
US 2014/0239365 A1    Aug. 28, 2014

(51) Int. Cl.
*H01L 29/423*    (2006.01)
*H01L 29/66*    (2006.01)
(Continued)

(52) U.S. Cl.
CPC .... *H01L 29/66825* (2013.01); *H01L 29/42332* (2013.01); *H01L 29/7881* (2013.01); *H01L 21/28273* (2013.01); *H01L 27/11524* (2013.01)
USPC .................... 257/316; 257/315; 257/E29.129

(58) Field of Classification Search
CPC .............. H01L 21/44; H01L 27/11556; H01L 27/11578; H01L 27/11582; H01L 27/0688; H01L 21/8221; H01L 29/7926; H01L 27/11551; H01L 29/66825; H01L 21/84; H01L 29/66833; H01L 27/105; H01L 29/792; G11C 11/00; G11C 13/00

USPC ............ 257/30, 37, 225, 260, 261, 288, 296, 257/300, 314–317, 320, 321, 327, 329, 390, 257/E21.179, E21.18, E21.66–E21.665, 257/E21.678–E21.683, E27.076, E27.077, 257/E27.078, E27.085, E27.102, E27.104, 257/E29.129, E29.3, E29.255, E29.309, 257/E29.33, E21.21, E27.06, E29.325; 438/142, 197, 199, 201, 211, 257, 593; 365/46, 100, 148, 163; 977/773, 810, 977/943

See application file for complete search history.

(56) References Cited

U.S. PATENT DOCUMENTS 5,570,315 A    10/1996 Tanaka et al.
5,774,397 A    6/1998 Endoh et al.
(Continued)

FOREIGN PATENT DOCUMENTS

DE    10 2008 009365 A1    10/2008

OTHER PUBLICATIONS (Eds.) R. Micheloni; G. Campardo; P. Olivo, Memories in Wireless Systems, Chapter 2 Nonvolatile Memories: NOR vs. NAND Architectures, L. Crippa, R. Micheloni, I. Motta and M. Sangalli, Springer-Verlag Berlin Heidelberg 2008.*

(Continued)

*Primary Examiner* — Victor A Mandala
(74) *Attorney, Agent, or Firm* — The Marbury Law Group PLLC

(57) ABSTRACT

A memory cell including a control gate located over a floating gate region. The floating gate region includes discrete doped semiconducting or conducting regions separated by an insulator and the discrete doped semiconducting or conducting regions have a generally cylindrical shape or a quasi-cylindrical shape.

5 Claims, 10 Drawing Sheets

(51) Int. Cl.
*H01L 29/788* (2006.01)
*H01L 21/28* (2006.01)
*H01L 27/115* (2006.01)

(56) References Cited

U.S. PATENT DOCUMENTS

| | | | |
|---|---|---|---|
| 6,015,738 A | 1/2000 | Levy et al. | |
| 6,046,935 A | 4/2000 | Takeuchi et al. | |
| 6,331,463 B1* | 12/2001 | Chen | 438/257 |
| 6,407,424 B2* | 6/2002 | Forbes | 257/315 |
| 6,646,302 B2 | 11/2003 | Kan et al. | |
| 6,656,792 B2 | 12/2003 | Choi et al. | |
| 6,700,155 B1* | 3/2004 | King et al. | 257/321 |
| 6,717,860 B1* | 4/2004 | Fujiwara | 365/185.24 |
| 6,723,606 B2 | 4/2004 | Flagan et al. | |
| 6,859,397 B2 | 2/2005 | Lutze et al. | |
| 6,881,994 B2 | 4/2005 | Lee et al. | |
| 6,913,984 B2 | 7/2005 | Kim et al. | |
| 6,917,542 B2 | 7/2005 | Chen et al. | |
| 6,927,136 B2 | 8/2005 | Lung et al. | |
| 6,991,984 B2 | 1/2006 | Ingersoll et al. | |
| 7,045,851 B2 | 5/2006 | Black et al. | |
| 7,119,395 B2 | 10/2006 | Gutsche et al. | |
| 7,138,680 B2 | 11/2006 | Li et al. | |
| 7,173,304 B2 | 2/2007 | Weimer et al. | |
| 7,221,588 B2* | 5/2007 | Fasoli et al. | 365/185.17 |
| 7,259,984 B2 | 8/2007 | Kan et al. | |
| 7,572,669 B2* | 8/2009 | Tuominen et al. | 438/99 |
| 7,649,779 B2 | 1/2010 | Ruttkowski et al. | |
| 7,723,186 B2 | 5/2010 | Purayath et al. | |
| 8,193,055 B1* | 6/2012 | Purayath et al. | 438/257 |
| 8,822,288 B2* | 9/2014 | Purayath et al. | 438/264 |
| 2004/0026682 A1 | 2/2004 | Jiang | |
| 2004/0130941 A1 | 7/2004 | Kan et al. | |
| 2004/0180491 A1 | 9/2004 | Arai et al. | |
| 2004/0256662 A1* | 12/2004 | Black et al. | 257/317 |
| 2005/0112820 A1 | 5/2005 | Chen et al. | |
| 2005/0122775 A1 | 6/2005 | Koyanagi et al. | |
| 2005/0258470 A1 | 11/2005 | Lojek et al. | |
| 2005/0287717 A1 | 12/2005 | Heald et al. | |
| 2006/0250836 A1 | 11/2006 | Herner et al. | |
| 2006/0250837 A1 | 11/2006 | Herner et al. | |
| 2007/0045604 A1 | 3/2007 | Liu et al. | |
| 2007/0158736 A1 | 7/2007 | Arai et al. | |
| 2007/0166917 A1* | 7/2007 | Tzeng et al. | 438/257 |
| 2008/0064181 A1* | 3/2008 | Okanishi | 438/449 |
| 2008/0242011 A1 | 10/2008 | Song et al. | |
| 2009/0001345 A1 | 1/2009 | Schricker et al. | |
| 2009/0014704 A1 | 1/2009 | Chen et al. | |
| 2009/0027944 A1 | 1/2009 | Ufert | |
| 2009/0097320 A1* | 4/2009 | Min et al. | 365/185.18 |
| 2009/0117697 A1 | 5/2009 | Park et al. | |
| 2009/0146140 A1 | 6/2009 | Kim et al. | |
| 2009/0162951 A1* | 6/2009 | Orimoto et al. | 438/8 |
| 2009/0168491 A1 | 7/2009 | Schricker et al. | |
| 2009/0189215 A1* | 7/2009 | Samanta et al. | 257/325 |
| 2010/0008128 A1 | 1/2010 | Yoshii et al. | |
| 2010/0190319 A1* | 7/2010 | Purayath et al. | 438/466 |
| 2011/0020992 A1 | 1/2011 | Purayath et al. | |
| 2011/0186799 A1 | 8/2011 | Kai et al. | |

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

Nozaki et al., "A 1-Mb EEPROM with MONOS Memory Cell for Semiconductor Disk Application," EEE Journal of Solid-State Circuits, vol. 26, No. 4, Apr. 1991, pp. 497-501.

Partial International Search Report, International Application No. PCT/US2011/023617, May 24, 2011.

International Preliminary Report on Patentability, International Application No. PCT/US2011/023617, Aug. 16, 2012.

International Search Report & Written Opinion, International Application No. PCT/US2011/023617, Jul. 13, 2011.

Chen et al., "Reliability Characteristics of NiSi Nanocrystals Embedded in Oxide and Nitride Layers for Nonvolatile Memory Application," Applied Physics Letters, 92, 152114 (2008).

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Komatsu et al., "Applying Nanotechnology to Electronics," Science & Technology Trends, Quarterly Review No. 16, Jul. 2005.

Guarini et al., "Low Voltage, Scalable Nanocrystal Flash Memory Fabricated by Templated Self-Assembly," IEEE Int. Electron Devices Meeting Tech. Diges, vol. 22, No. 2, Dec. 2003.

Miura et al., "Non-Volatile Flash Memory with Discrete Bionanodot Floating Gate Assembled by Protein Template," Nanotechnology, Jun. 25, 2008, 19(25), Abstract.

U.S. Appl. No. 13/708,677, V. Purayath et al., "Non-Volatile Memory Structure Containing Nanodots and Continuous Metal Layer Charge Traps and Method of Making Thereof," Specification and drawings, filed Dec. 7, 2012.

U.S. Appl. No. 13/690,054, V. Purayath et al., "Select Gate Formation for Nanodot Flat Cell," Specification and drawings, filed Nov. 30, 2012.

U.S. Appl. No. 13/708,587, V. Purayath et al., "NAND Memory Device Containing Nanodots and Method of Making Thereof," Specification and drawings, filed Dec. 7, 2012.

* cited by examiner

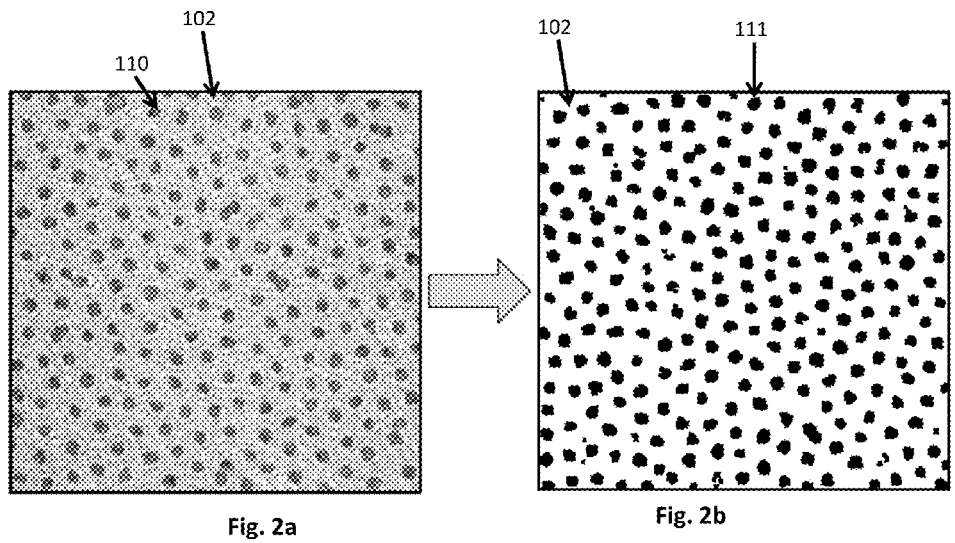
Fig. 2a　　Fig. 2b
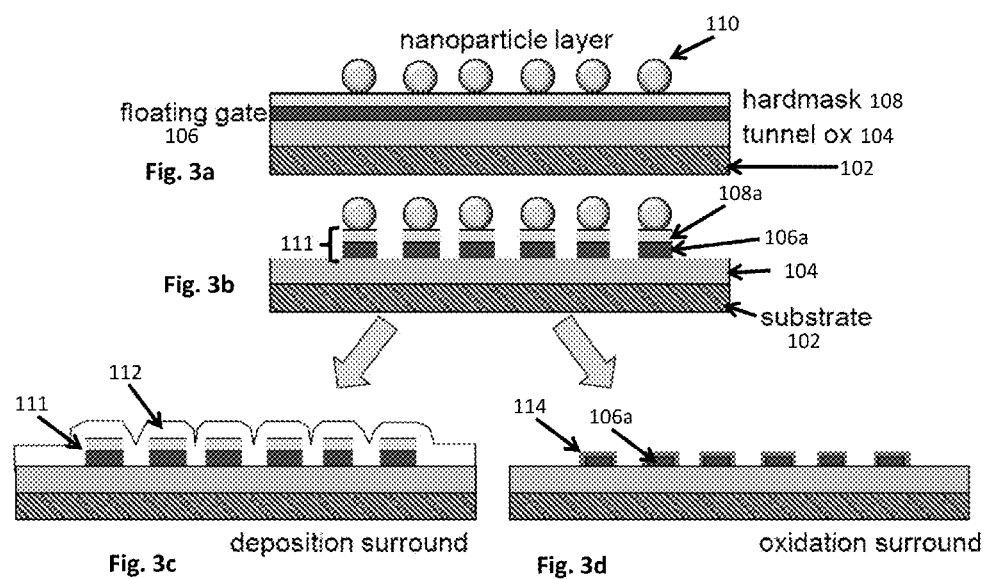
Fig. 3a
Fig. 3b
Fig. 3c deposition surround
Fig. 3d oxidation surround

PRIOR ART

METHOD FOR USING NANOPARTICLES TO MAKE UNIFORM DISCRETE FLOATING GATE LAYER

FIELD

The present invention relates to memory devices and methods of fabricating memory devices using nanoparticles.

BACKGROUND

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 6 is a top view showing a single NAND string and FIG. 7 is an equivalent circuit thereof. The NAND string depicted in FIGS. 6 and 7 includes four transistors 600, 602, 604 and 606 in series between a first select gate 620 and a second select gate 622. Select gate 620 connects the NAND string to a bit line via bit line contact 626. Select gate 622 connects the NAND string to a common source line via source line contact 628. Each of the transistors 600, 602, 604 and 606 is an individual storage element and includes a control gate and a floating gate. For example, transistor 600 includes control gate 600CG and floating gate 600FG, transistor 602 includes control gate 602CG and floating gate 602FG, transistor 604 includes control gate 604CG and floating gate 604FG, and transistor 606 includes control gate 606CG and floating gate 606FG. Control gate 600CG is connected to word line WL3, control gate 602CG is connected to word line WL2, control gate 604CG is connected to word line WL1, and control gate 606CG is connected to word line WL0.

Note that although FIGS. 6 and 7 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

SUMMARY

One embodiment relates to a memory cell including a control gate located over a floating gate region. The floating gate region includes discrete doped semiconducting or conducting regions separated by an insulator and the discrete doped semiconducting or conducting regions have a generally cylindrical shape or a quasi-cylindrical shape.

Another embodiment relates to a method of making a memory cell including forming a mask layer comprising a plurality of nanodots over a floating gate layer and etching the floating gate layer using the plurality of nanodots as a mask to form a floating gate region comprising a plurality of discrete semiconducting or conducting regions.

Another embodiment relates to a method of making a memory cell including forming a hard mask layer over a floating gate layer, forming a mask layer comprising a plurality of nanodots over the hard mask layer, etching the hard mask layer using the plurality of nanodots to form a plurality of discrete hard mask regions, removing the plurality of nanodots and etching the floating gate layer using the plurality of discrete hard mask regions as a mask to form a floating gate region comprising a plurality of discrete semiconducting or conducting regions after the step of removing the plurality of nanodots.

BRIEF DESCRIPTION OF THE DRAWINGS

FIGS. 2a and 2b are electron micrographs that illustrate a transfer the pattern of the nanoparticle layer into the subsequent floating gate layer.

FIGS. 3a-3k are schematic diagrams illustrating process flows of alternative methods of fabricating memory cells according to embodiments.

DETAILED DESCRIPTION

Figure 1:
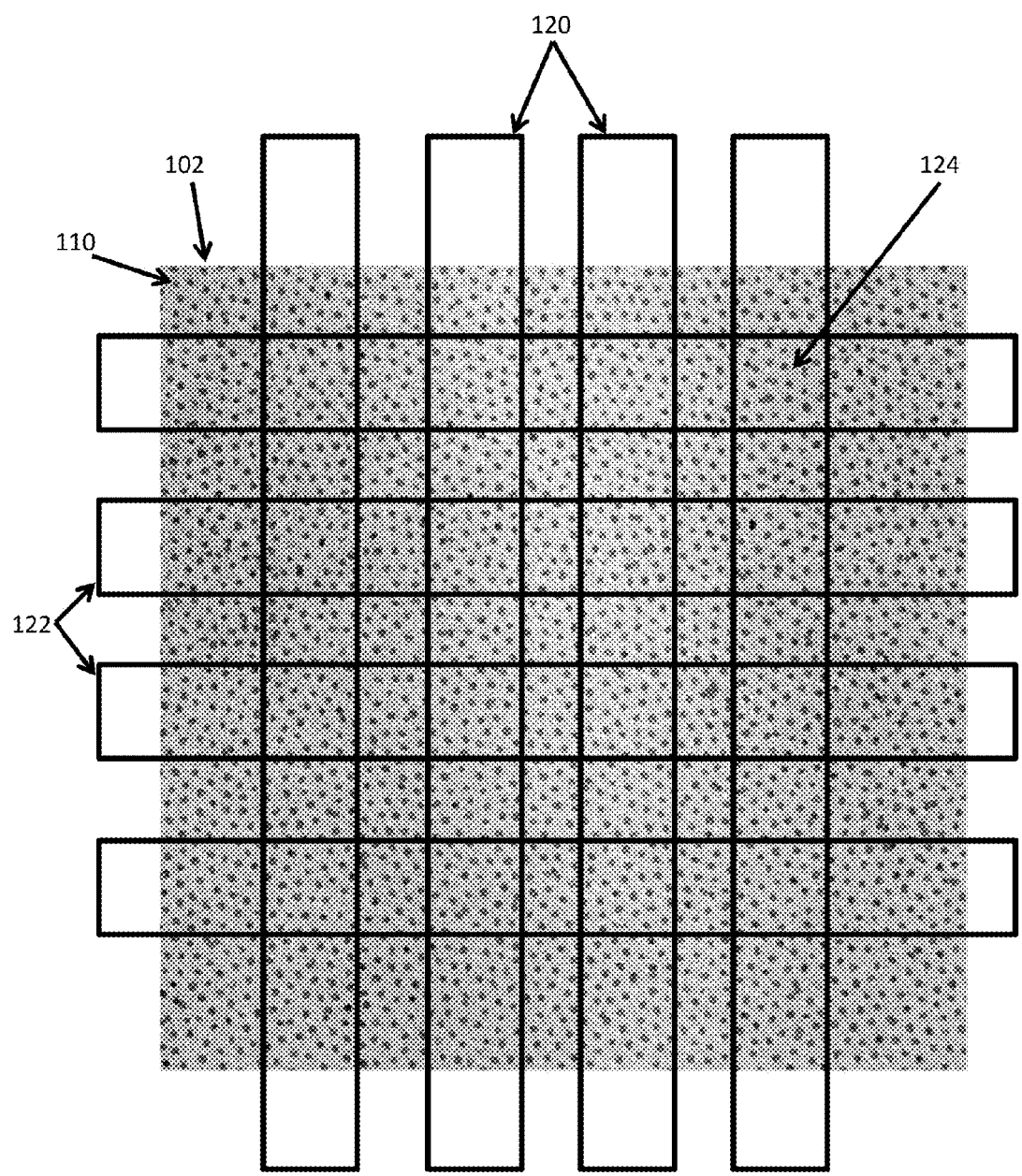
FIG. 1 is an electron micrograph illustrating the distribution of a single layer of nanodots on a substrate.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Various embodiments include non-volatile memory devices having nanostructure-based charge storage regions and fabrication processes for such devices.

Embodiments provide the use of nanostructure coatings as a mask to pattern nanostructure floating gate regions. The nanostructure coatings are removed after the floating gate regions are patterned.

The small size of nanostructures makes them attractive for forming charge storage regions, such as the floating gates for non-volatile memory cells, as device dimensions continue to be scaled-down. In a storage element, nanoparticles, such as nanodots, can be used as a mask to fabricate charge (e.g., electrons) storage nanostructures. The use of nanostructures as charge-storing regions in memory device, such as non-volatile memory device, provides many advantages, including allowing reduced programming voltages, resulting in reduced power/current consumption in the memory device, and scaling to ever smaller dimensions in future generation memory devices.

Nanostructures typically have at least one characteristic dimension that is less than about 500 nm along the smallest axis of the structure. Nanostructures may have characteristic dimensions that are less than 500 nm, for example, less than 10 nm, or even less than 1 nm. In some nanostructures, each of its dimensions may be less than 10 nm, or even 1 nm. By way of non-limiting example, nanostructures include nanowires, nanorods, nanotubes, bridge nanostructures, nanotetrapods, tripods, bipods, and roughly or exactly spherical nanostructures which are referred to as nanodots, but may also be referred to as nanoparticles, quantum dots (nanostructure with quantum confinement) or nanocrystals (having a crystalline structure). Nano structures can be, for example, substantially crystalline, substantially mono-crystalline, polycrystalline, amorphous or a combination thereof.

A nanostructure in one example is comprised of substantially spherical nanosparticles or nanodots. Nanodots can include essentially any material, such as conductors, non-conductors, and semiconductors. By way of non-limiting example, nanostructures may include materials such as silicon nitride (SiN, e.g., $Si_3N_4$), silicon (Si), Cobalt (Co), gold (Au), iridium (Ir), iron platinum alloys (FePt), nickel (Ni), palladium (Pd), platinum (Pt), ruthenium (Ru), tantalum (Ta), tantalum nitride (TaN), tellurium (Te), tungsten (W), and the like. An array of nanostructures may be pre-formed or synthesized prior to use in fabrication of the memory structure. For example, the nanostructures may include a coating having a ligand associated with a surface of the nanostructure, for example, a silsesquioxane ligand. Nanostructures may also be coated with insulating shells such as oxides or nitrides. In one example, the nanostructures are metal particles which are generally spherical (i.e., nanodots) and have a diameter of about 1 to 30 nm, such as 1-5 nm, for example 1-3 nm Although, other sizes and shapes can be used as well (e.g., polygonal).

In one embodiment, the nanostructures are free of solvent in their formation, while in others the nanostructures are dispersed in one or more solvents. In an embodiment, the nanostructures may form a disordered array such as an mono-layer. A solution of nanostructures can be formed by deposition processes, including spin coating, dip coating, spraying, soaking and other techniques. More information regarding nanostructures and their solutions can be found in U.S. Pat. No. 7,723,186 to Purayath, et al., and U.S. Pat. No. 8,193,055 to Purayath et al., which are both incorporated by reference herein in their entirety.

In one example, polymer micelle technology may be employed to form nanostructures with a high degree of uniformity. If desired, such technology can be used to fabricate self-aligned nanostructures with sizes, e.g., from a few nm to 30 nm (or more). A copolymer solution may be formed, followed by adding salt to provide metal salt ions in a core or micelle, e.g., cavity, of the copolymer, and performing a metal salt reduction to form a metal nanostructure in the core. The polymers may in powdered form, for example, and dissolved in an organic solvent. In other examples, the nanostructures are not dispersed in a solvent.

The copolymer solution with the nanostructures can be deposited onto the substrate. The size and spacing of the nanostructures can be tailored based on the molecular weight of the block copolymer and the amount of the metal salt used. After being deposited, the solution may be partially or entirely removed from the nanostructures, such as by evaporation.

In one embodiment, a coupling or association agent is used to form the nanostructure coating. A coupling layer may be disposed over a dielectric (e.g., oxide) layer. The coupling layer can include a chemical group that interacts with a nanostructure and/or ligand coating of a nanostructure. The coupling layer may be an amino functional silane group. By way of example, coupling layers include thiol, amine, alcohol, phosphonyl, carboxyl, boronyl, fluorine, phosphinyl, alkyl, aryl, etc.

A nanostructure coating may then be applied over the substrate (e.g. over the hard mask or floating gate material layer as will be described below). The nanostructures may be coated with a ligand to interact with the coupling layer. The nanostructures and/or ligands interact with the coupling layer, forming one or more nanostructure layers over the dielectric (e.g., oxide) layer at the active areas of the substrate. The substrate with the nanostructures can be dried, such as by dry nitrogen blowing with no heat. The coupling layer may be removed after forming the nanostructure coating.

The nanostructure coating may be subjected to ultraviolet (UV) curing over all or a portion of the nanostructure coating. Photoresist or another suitable masking material can be applied over select regions of the coating before applying UV light to the substrate surface. After selectively curing the nanostructure layer, a rinse or wash can be applied to the substrate which will remove the nanostructure layer at locations where it has not been cured. Other techniques can be used to remove the nanostructure layer from select region(s).

Photoactivatable compounds may be incorporated into a nanostructure solution. Where a coupling layer is used, the coupling layer material composition may be photoactivatable, such that the bond between the coupling layer and ligand or nanostructure is formed only upon exposure to light. Numerous photoactivatable compounds as known in the art may be used. By way of example, such compounds may include a phenyl azide group, which when photoactivated can from a covalent bond with, e.g., a silsesquioxane ligand comprising a coating associated with a surface of the nanostructures. Other photoactivatable compounds include an aryl azide group (e.g., a phenyl azide, hydroxphenyl azide, or nitrophenyl group), a psoralen, or a diene.

FIG. 1 is an electron micrograph illustrating the distribution of a nanoparticle coating comprising a single layer of nanodots 110 on a substrate 102. Superimposed on FIG. 1 are locations of word lines 120 and bit lines 122 according to an embodiment. The intersection of the word lines 120 and the bit lines 122 defines a floating gate region 124 of a memory cell of a memory device, such as an NAND memory device. The size (e.g. diameter if the nanodots are spherical) of the nanodots is selected depending on the width of the word lines 120 and bit lines 122. Specifically, the size of the nanodots is selected such that the widths of the word lines 120 and the bit lines 122 are several times wider than the size of the nanodots 110 to make sure that each floating gate regions 124 contains several (e.g. at least two, such as 2-10, e.g., 3-4) nanodots 110. For example, if the word lines 120 and the bit lines 122 are 15-25 nm, e.g. 20 nm wide, then the nanodots 110 may have an average diameter of 1-10 nm, such as 2-5 nm. As illustrated in FIG. 1, the nanodots may be randomly distributed across the surface of the substrate 102. That is, it is not necessary for the nanodots to be deposited in a regular array. However, a uniform nanodot distribution is desired.

FIGS. 2a and 2b are electron micrographs that illustrate a transfer the pattern of the layer nanodots 110 into the subsequent hard mask layer 108 which is used as a mask to etch the floating gate layer 106. Specifically, FIG. 2a illustrates a substrate 102 covered with a monolayer of nanodots 110. FIG. 2b illustrates the corresponding pillars 111 of hard mask material and floating gate material formed by etching a hard mask layer 108 located on top of a floating gate layer 106 using the nanodots 110 as a mask followed by removing the nanodots 110.

Figure 3E:
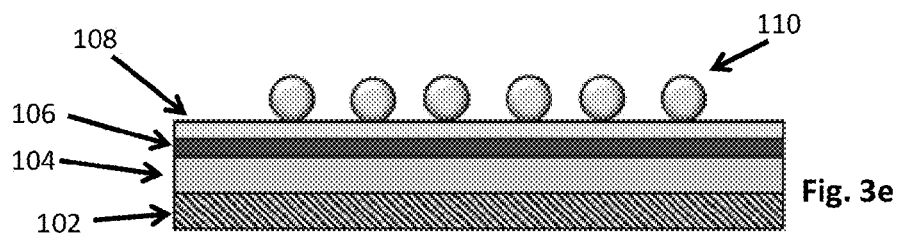

FIGS. 3a-3j illustrate methods of making memory devices according to embodiments of the invention. As illustrated in FIG. 3a, a substrate 102 is provided with a tunnel dielectric layer 104 (e.g. a $SiO_2$ layer or ONO stack), a layer of floating gate material 106 and an optional hard mask layer 108. A layer of nanodots 110 is provided on the hard mask layer 108, such as by deposition or by nanodot formation by any of the methods discussed above.

The nanodots 110 can be made of any suitable material with etch selectivity to an underlying material so that the nanodots 110 can be used as a mask during etching of the underlying material. For example, the nanodots 110 may be made of a metal, such as ruthenium, or carbon. The floating gate material 106 may be made of any suitable floating gate charge storage/trapping material, such as a conductive material that includes metal, such as aluminum, tungsten or tungsten nitride, or a semiconductor material, such as doped polysilicon (e.g., p-type or n-type doped polysilicon). The hard mask layer 108 may be made of any material that has different etch characteristics from the floating gate material 106, such as silicon nitride, silicon carbide, aluminum oxide, or a metal.

In FIG. 3b, the layer of floating gate material 106 and the hard mask layer 108 are etched using the nanodots 110 as an etch mask. Any suitable anisotropic or isotropic etch may be used. The result of this etching step are pillars 111 that include disks 106a, 108a of floating gate material 106 and hard mask layer 108 material. If an anisotropic etch is used, then the disks 106a have a generally cylindrical shape shown in FIG. 3b. If an isotropic etch is used, then the disks 106a have a quasi-cylindrical shape shown in FIG. 3k. A quasi-cylindrical shape may comprise a truncated cone having a concave rather than a straight sidewall (e.g., a hyperbolic paraboloid or hyperboloid shape). Next, the nanodots 110 are removed, such as by selectively dry or wet etching or chemical-mechanical polishing (CMP). In an embodiment illustrated in FIG. 3c, the pillars 111 are coated with a blocking dielectric 112. Preferably, the blocking dielectric 112, such as $SiO_2$ or an ONO stack, fills the gaps between pillars 111 and covers the tops of the pillars 111. Thus, the insulator that separates the pillar 111 comprises a portion (e.g., bottom portion) of the blocking dielectric 112.

In an alternative embodiment illustrated in FIG. 3d, after removing the nanodots 110 or together with removing the nanodots 110, the disk 108a of hard mask layer 108 is removed from the pillars 111, such as by selectively dry or wet etching or chemical mechanical polishing (CMP). The disks 106a are made of oxidizable material, e.g. polysilicon, aluminum, etc. Next, the disks 106a of floating gate layer 106 material are oxidized to form a blocking dielectric 114 on the exposed top and side surfaces of the disks 106a of floating gate material 106. In this embodiment, the final size (e.g. diameter and height) of the disks 106a of floating gate material 106 are reduced relative to the initial size of the disks 106a of floating gate material 106 due to consumption of some of the floating gate material 106 in forming the blocking dielectric 114. Optionally, the oxide covered pillars 106a/114 may be coated with an additional insulator or blocking dielectric 112. In this embodiment, the blocking dielectric 114 forms a portion of an insulating layer between pillars 106a.

Figure 3F:
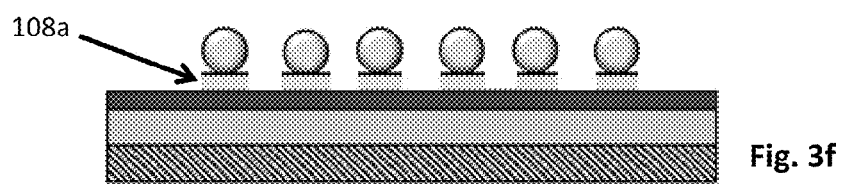
Figure 3G:
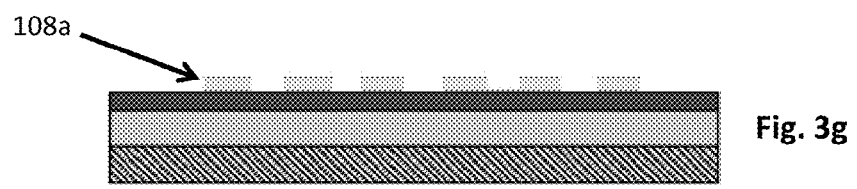
Figure 3H:
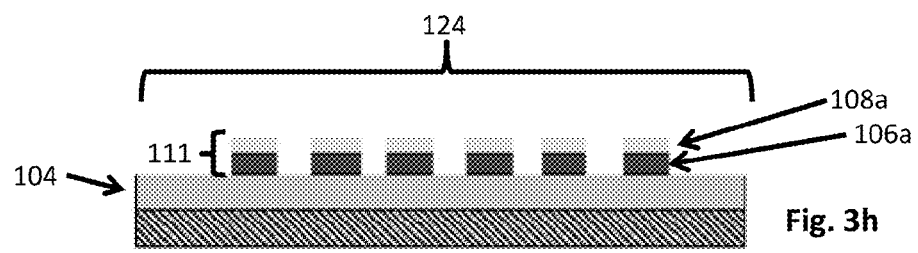
Figure 3I:
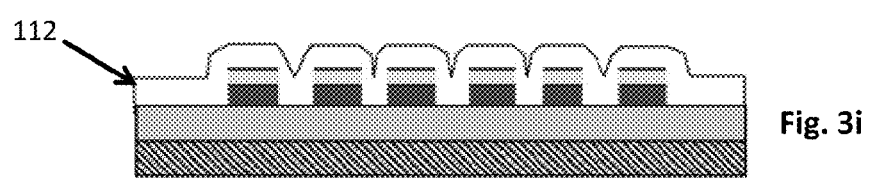
Figure 3J:
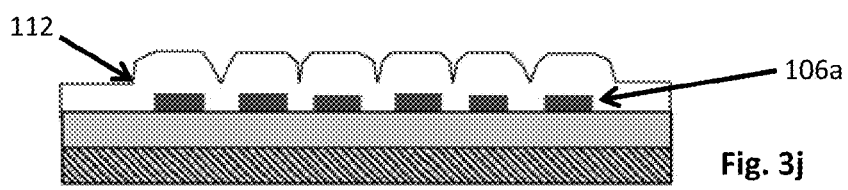
Figure 3K:
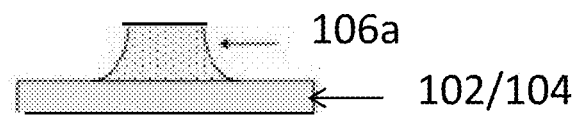

In alternative embodiments of the method illustrated in FIG. 3e-3j, a hard mask layer 108 is formed over a floating gate layer 106. Then a mask layer of nanodots 110 is formed over the hard mask layer 108 (FIG. 3e). The hard mask layer 108 is then etched using the layer of nanodots 110 to form a plurality of discrete disks 108a of hard mask layer 108 material (FIG. 3f). Next, the nanodots 110 are removed, leaving the discrete disks 108a of hard mask layer 108 material (FIG. 3g). The floating gate layer 106 is then etched using the discrete disks 108a of hard mask layer 108 material as a mask to form floating gate regions 124 made up of pillars 111 of discrete disks 108a of hard mask layer 108 material and discrete disks 106a of semiconducting or conducting floating gate layer 106 material (FIG. 3h). As illustrated in FIG. 3i, a blocking dielectric 112 may then be formed over the pillars 111 of discrete disks 108a of hard mask layer 108 material and discrete disks 106a of floating gate layer 106 material. Alternatively as illustrated in FIG. 3j, the discrete disks 108a of hard mask layer 108 may be removed and then the blocking dielectric 112 formed over and between the discrete disks 106a of floating gate layer 106 material. The blocking dielectric 112 may be planarized, such as by chemical mechanical planarization. Alternatively, another dielectric layer may be formed over the blocking dielectric 112 and then planarized to obtain the planar dielectric layer shown in FIG. 4a.

Figure 4A:
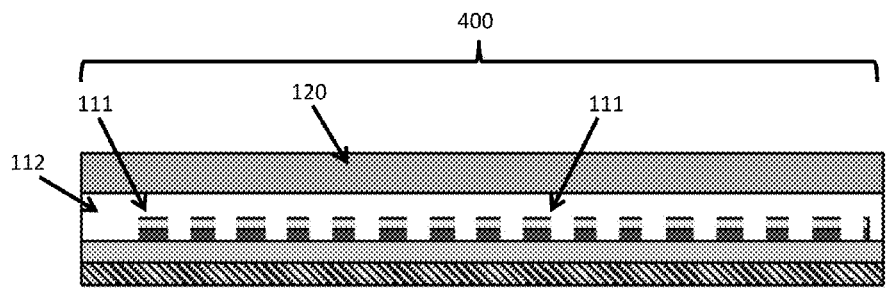
FIGS. 4a-4d are schematic diagrams illustrating the ability to tune the aspect ratio of the nanostructures (nanostructure height:nanostructure width/diameter) according to embodiments of the method.

FIGS. 4a-4d illustrate the ability to tune the aspect ratio of the nanostructures (nanostructure height:nanostructure width/diameter) formed according to embodiments of the method. FIG. 4a illustrates a schematic side cross-sectional view in the word line direction of a portion of a memory device 400, such as a NAND string, according to an embodiment. As illustrated, the memory device 400 includes a plurality of pillars 111 that include a floating gate disk 106a and an optional hard mask disk 108a located on a tunnel dielectric layer 104 located on a substrate 102. A blocking dielectric layer 112 surrounds the tops and sides of the pillars 111. A control gate line, such as a word line 120, is formed on the blocking dielectric layer 112. The control gate line may be formed by forming a layer of control gate material over the blocking dielectric layer 112 and patterning the control gate layer to form a plurality of word lines 120 such that a width of each word line 120 extends over a plurality of the discrete semiconducting or conducting regions 106a and each memory cell 400 (FIGS. 4b-4d) includes a plurality of the discrete semiconducting or conducting regions 106a.

Figure 4B:
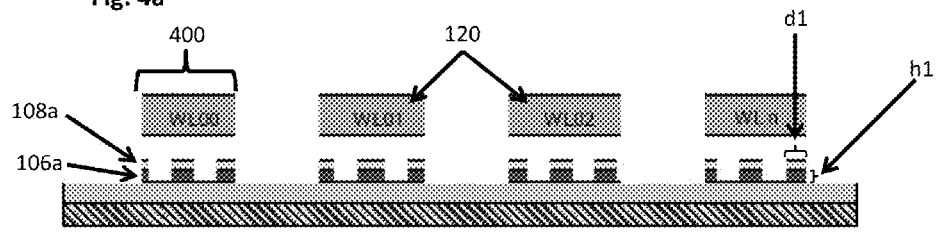
Figure 4C:
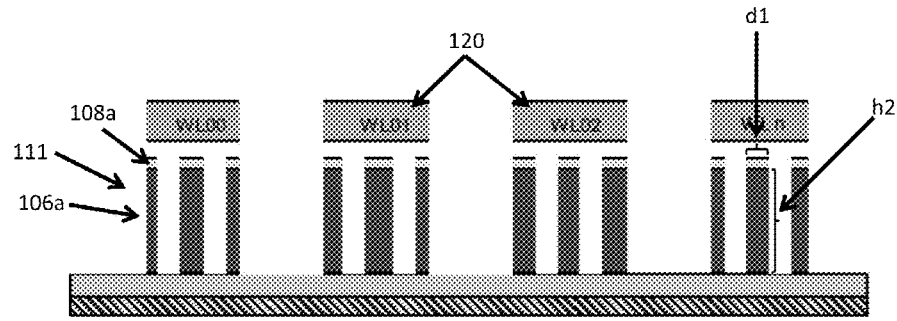
Figure 4D:
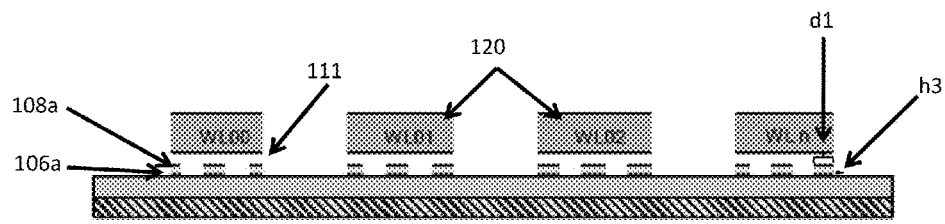

FIG. 4b is a schematic side cross-sectional view in the bit line direction through the device of FIG. 4a taken 90° from the view illustrated in FIG. 4a. The memory cells 400 may be formed by etching using word lines 120 as a mask. In the embodiment illustrated in FIG. 4b, each word line 120 (WL00-WLn) has a width which extends over plural pillars 111, such as 2-10 pillars, e.g. 3-4 pillars. Each pillar has a height of h1 and a diameter of approximately d1. As illustrated, some pillars 111 located at the outer edges of the word lines 120 (WL 00-WLN) may only be partially covered by the word lines 120 (WL00-WLN) and have a diameter smaller than d1. The aspect ratio for this embodiment is h1/d1 for pillars 111 located away from the word line 120 edge.

In embodiments, the nanostructures of the memory cells 400 have a pillar shape. That is, in these embodiments, the semiconducting or conducting regions 106a are not spherical. In these embodiments, the semiconducting or conducting regions 106a have substantially flat top and bottom surfaces with substantially straight sidewalls (e.g., the regions 106a have an exact cylindrical shape or a substantially cylindrical shape which includes lithography and/or etching induced deviations or non-uniformities) when anisotropic etching is used. If an isotropic etch is used, then the semiconducting or conducting regions 106a have a quasi-cylindrical shape shown in FIG. 3k. A quasi-cylindrical shape may comprise a truncated cone having a concave rather than a straight sidewall (e.g., a hyperbolic paraboloid or hyperboloid shape). Further, in embodiments, the semiconducting or conducting regions 106a are randomly distributed in the blocking dielectric layer 112 under the control gate 120 comprising a single control gate 120.

Depending on the use of the memory device, other aspect ratios may be desired. For example, in the embodiment illustrated in FIG. 4c, the device has a substantially higher aspect ratio h2/d1 such as h2>d1, e.g. 2:1 to 100:1. In the embodiment illustrated in FIG. 4d, the device has a substantially smaller aspect h3/d1, such as h3<d1, e.g. 0.1:1 to 0.9:1.

Figure 5A:
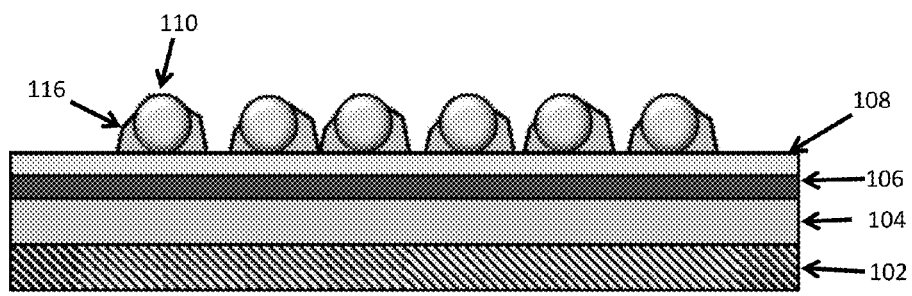
FIGS. 5a-5g are schematic diagrams illustrating process flows of alternative methods of fabricating memory cells using sidewall spacers according to embodiments.
Figure 5B:
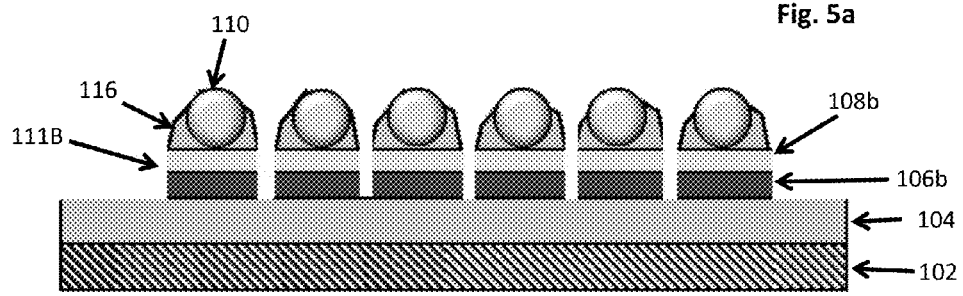

FIGS. 5a-5b illustrate a method of making the memory device 300 according to an alternative embodiment. As illustrated in FIG. 5a, sidewall spacers 116 may be formed on the sides of the nanodots 110. That is, the method includes forming sidewall spacers 116 on the plurality of nanodots 110 prior to etching the floating gate layer 106 and then etching the floating gate layer 106 using the plurality of nanodots 110 and the sidewall spacers 116 as a mask. This method is advantageous if the nanodots 110 are smaller than desired. That is, this method is advantageous if is desirable to fabricate pillars 111 with a larger diameter than the nanodots 110. Sidewall spacers 116 may be formed by depositing a thin layer of material (e.g., silicon nitride or metal) over the nanodots 110, then performing an anisotropic spacer etch.

Figure 5C:
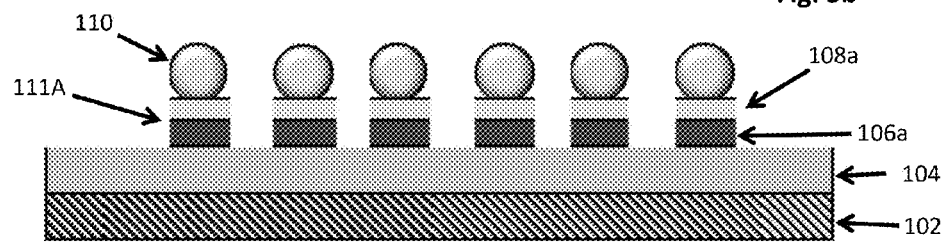

As illustrated in FIG. 5b, etching the floating gate layer 106 and the hard mask layer 108 with nanodots 110 having sidewall spacers 116 as a mask results in wider pillars 111B than pillars 111A made by the same nanodots 110 without sidewall spacers 116 as shown in FIG. 5c. Thus, the disk 106b of floating gate material is wider than the disk 106a of floating gate material 106. Additionally, the disk 108b of hard mask material 108 is wider than the disk 108a of hard mask material 108.

Figure 5D:
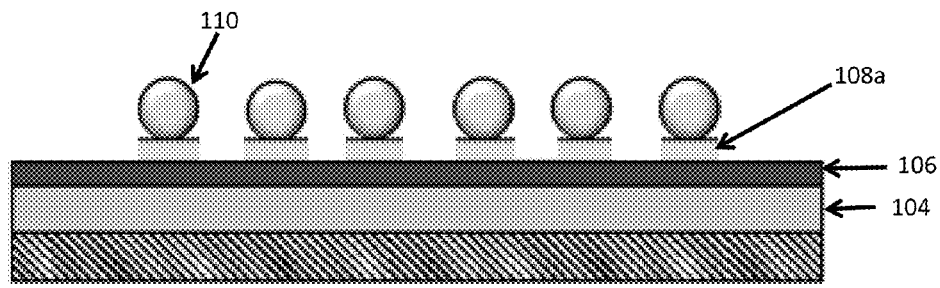
Figure 5E:
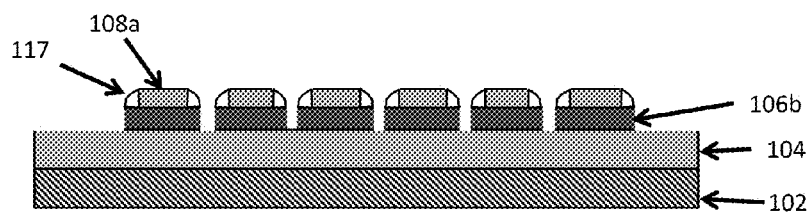

FIGS. 5d and 5e illustrate an alternative method using sidewall spacers 117. In this method, the hard mask layer 108 is first etched using the as-deposited nanodots 110 as an etch mask to form discrete disks 108a of hard mask 108 material as described above in reference to FIG. 3g. The etch stops on the layer 106 of floating gate material which is not etched. The nanodots 110 are then removed. Then, the sidewall spacers 117 are formed on the disks 108a of hard mask layer 108 by depositing a thin layer of material over the disks 108a of hard mask layer 108 and then performing an anisotropic spacer etch. The floating gate layer 106 is then etched using the hard mask/sidewall spacer structure (108a/117) as an etch mask to form the disks 106b of floating gate material.

Figure 5F:
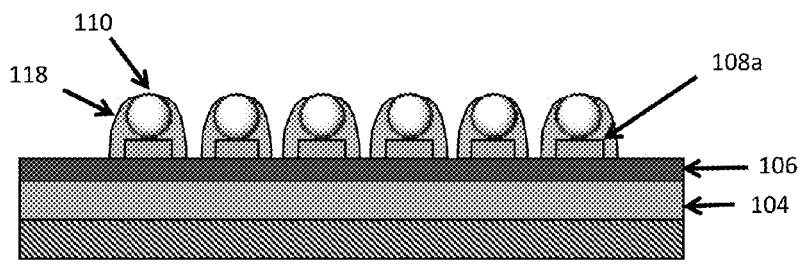
Figure 5G:
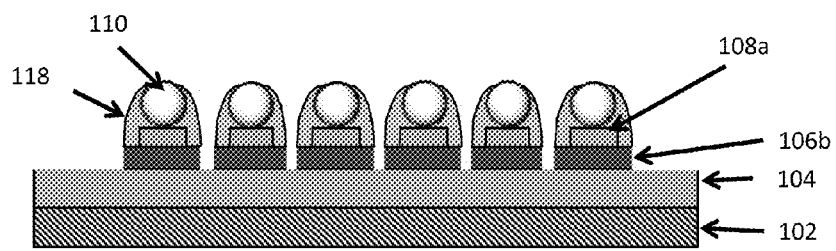
Figure 6:
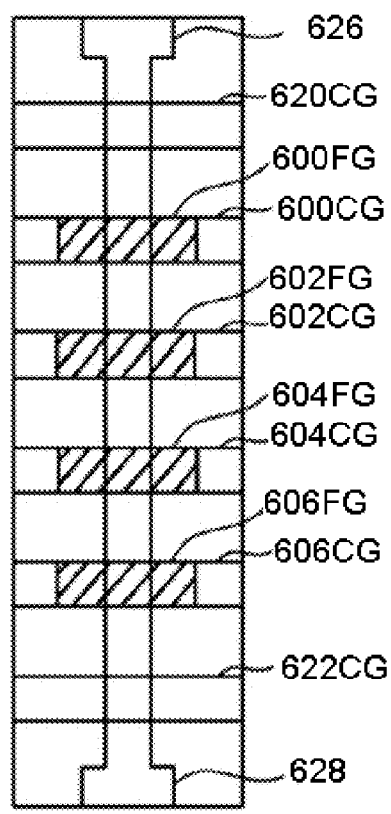
FIG. 6 is a top view of a prior art NAND string.
Figure 7:
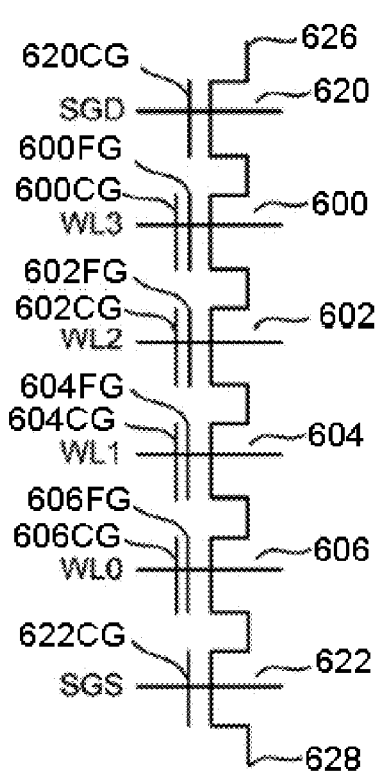
FIG. 7 is an equivalent circuit diagram of the prior art NAND string depicted in FIG. 6.

Another alternative embodiment is illustrated in FIGS. 5f and 5g. In this embodiment, similarly to the embodiment illustrated in FIGS. 5d and 5e, the hard mask layer 108 is first patterned using the nanodots 110 as an etch mask. In contrast to the previous embodiment, however, the nanodots 110 are not removed. In this embodiment, sidewall spacers 118 are formed over the nanodots 110 and the disks 108a of hard mask material 108. The floating gate layer 106 is etched using this structure (110, 108a, 118) as an etch mask. Thus, this embodiment of the method includes etching a hard mask layer 108 located between a plurality of nanodots 110 to form a plurality of discrete hard mask regions 108a, forming sidewall spacers 116 on the plurality of nanodots 110 and the plurality of discrete hard mask regions 108a prior to etching the floating gate layer 106, and etching the floating gate layer 106 using the plurality of nanodots 110, the discrete hard mask regions 108a and the sidewall spacers 118.

In an alternative embodiment, the optional hard mask layer 10 is omitted. This method includes forming a mask layer comprising a plurality of nanodots 110 over a floating gate layer 106 and etching the floating gate layer 106 using the plurality of nanodots 110 as a mask to form a floating gate region 124 that includes a plurality of discrete semiconducting or conducting regions 106a, as described above.

Figure 8:
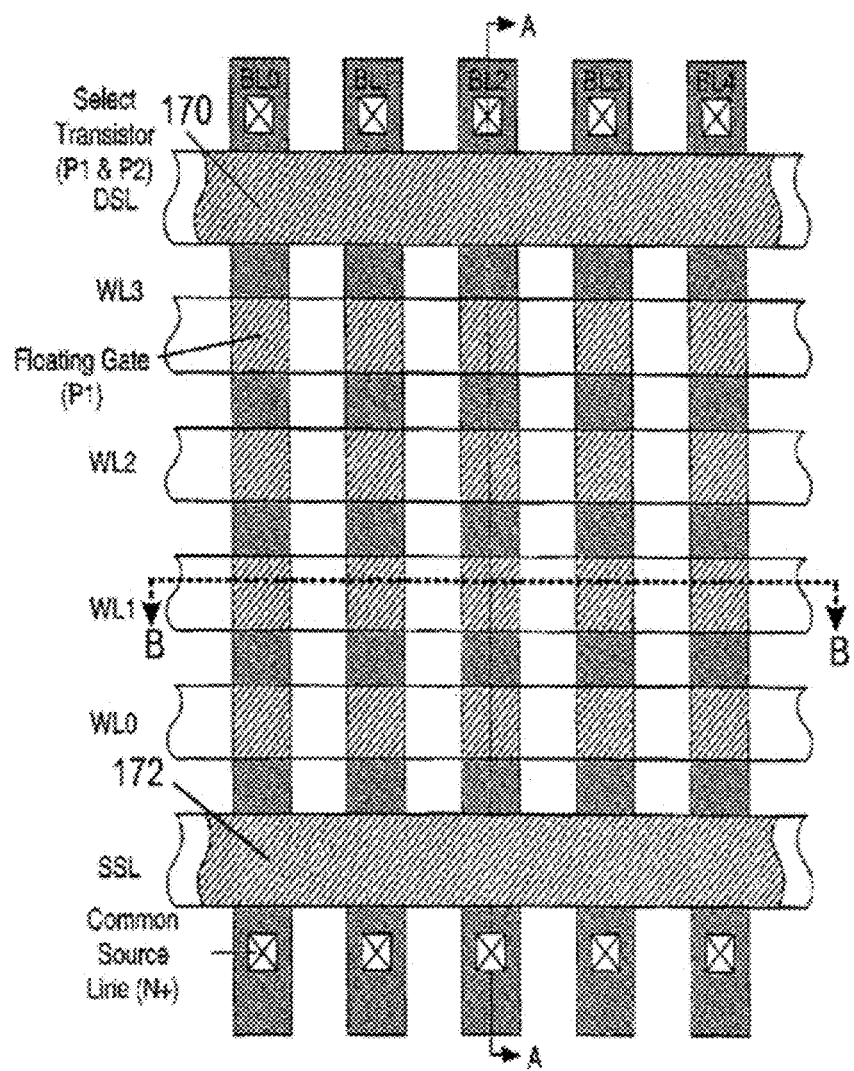
FIG. 8 is a plan view of a portion of a NAND flash memory array.
Figure 9:
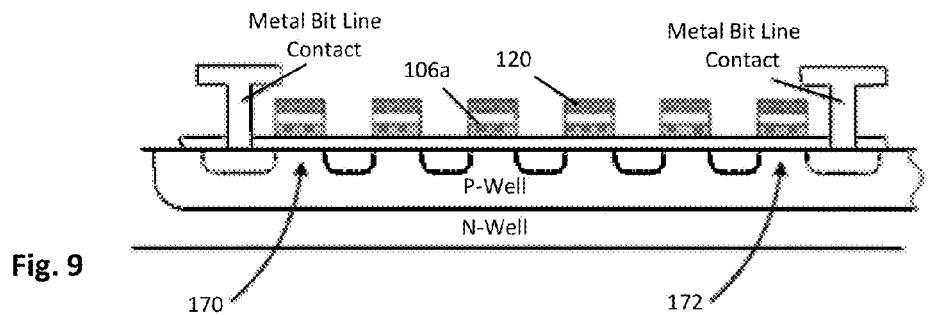
FIG. 9 is an orthogonal cross-section view taken along line A-A of the portion of the flash memory array depicted in FIG. 8.

A portion of a NAND memory array is shown in plan view in FIG. 8. BL0-BL4 represent bit line connections to global vertical metal bit lines (not shown). Four floating gate memory cells are shown in each string by way of example. Typically, the individual strings include 16, 32, 64 or more memory cells, forming a column of memory cells. Control gate (word) lines labeled WL0-WL3 extend across multiple strings over rows of floating gates, often in polysilicon. FIG. 9 is a cross-sectional view taken along line A-A of FIG. 8, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL.

In traditional devices, the floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774, 397 and 6,046,935, which are hereby incorporated by reference in their entirety.

Figure 10:
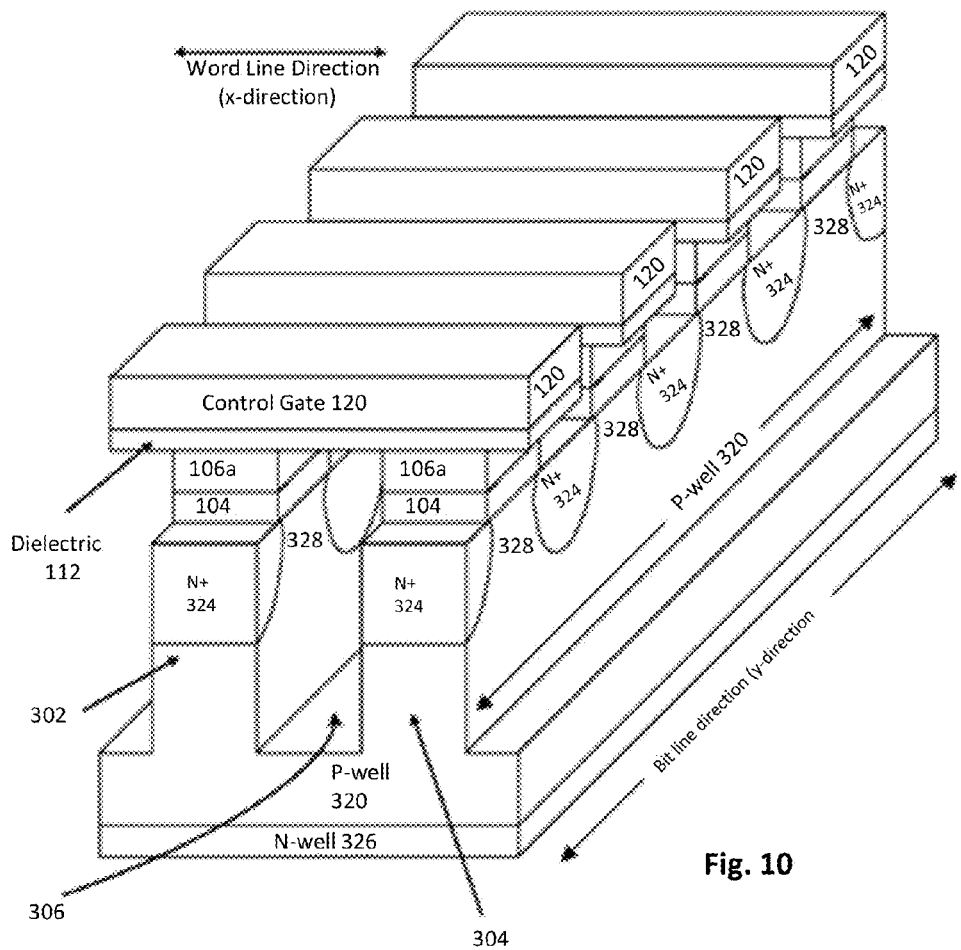
FIG. 10 is a three-dimensional drawing of a pair of four word line long portions of two NAND strings.

FIG. 10 is a three-dimensional block diagram of two exemplary NAND strings 302 and 304 that may be fabricated as part of a larger flash memory array. FIG. 10 depicts four memory cells on strings 302 and 304 as an example. FIG. 10 depicts N-well 326 below P-well 320 and N+ source and drain regions 324 in the p-well 320. The channels 328 of the transistors of the NAND strings 302 are located between the N+ source and drain regions 324. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 326 is not shown in FIG. 10. In one embodiment, the control gates 120 above the blocking dielectric 112 form the word lines 120. A continuous layer of conductive material can be formed which is consistent across a row in order to provide a common word line or control gate 120 for each device on that word line 120. In such a case, this layer can be considered to form a control gate 120 for each memory cell at the point where the layer overlaps a corresponding floating gate layer 332 which comprises the discreet regions 106a described in the previous embodiments. In other embodiments, individual control gates can be formed and then interconnected by a separately formed word line.

When fabricating a NAND-type non-volatile memory system, including NAND strings as depicted in FIG. 10, electrical isolation is provided in the word line direction between adjacent strings. In the embodiment depicted in FIG. 10, NAND string 302 is separated from NAND string 304 by an open area or void 306. Typically, an insulating material or dielectric is formed between adjacent NAND strings in this open area.

Embodiments disclosed above advantageously do not suffer from the nanodot stacking problems of using nanodots as the floating gates as in the devices described in U.S. Pat. Nos. 7,723,186 and 8,193,055 discussed above. Further, the nanodot materials suitable for use in the embodiments above are not limited to metals as in the devices described in U.S. Pat. Nos. 7,723,186 and 8,193,055. This is because the nanodots of the embodiments above are used to pattern the layer 106 of floating gate material. The disks 106a of floating gate material may be made of doped polysilicon rather than exotic precious metals such as ruthenium.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A memory cell, comprising:
a control gate located over a floating gate region and a continuous tunnel dielectric layer located under the floating gate region, wherein:
the floating gate region comprises plural discrete doped semiconducting or conducting regions separated by an insulator located over the continuous tunnel dielectric layer; and
the discrete doped semiconducting or conducting regions have a cylindrical or a hyperbolic paraboloid shape; and
further comprising discrete mask regions having a cylindrical or a hyperbolic paraboloid shape and located between the discrete doped semiconducting or conducting regions and the control gate.

2. The memory cell of claim 1, wherein a diameter of the discrete mask regions is less than a diameter of the discrete doped semiconducting or conducting regions.

3. A memory cell, comprising:
a control gate located over a floating gate region and a continuous tunnel dielectric layer located under the floating gate region, wherein:
the floating gate region comprises plural discrete doped semiconducting or conducting regions separated by an insulator located over the continuous tunnel dielectric layer; and
the discrete doped semiconducting or conducting regions have a cylindrical or a hyperbolic paraboloid shape;
wherein the semiconducting or conducting regions have flat top and bottom surfaces.

4. A memory cell, comprising:
a control gate located over a floating gate region and a continuous tunnel dielectric layer located under the floating gate region, wherein:
the floating gate region comprises plural discrete doped semiconducting or conducting regions separated by an insulator located over the continuous tunnel dielectric layer; and
the discrete doped semiconducting or conducting regions have a cylindrical or a hyperbolic paraboloid shape;
wherein the semiconducting or conducting regions have straight sidewalls.

5. A memory cell, comprising:
a control gate located over a floating gate region and a continuous tunnel dielectric layer located under the floating gate region, wherein:
the floating gate region comprises plural discrete doped semiconducting or conducting regions separated by an insulator located over the continuous tunnel dielectric layer; and
the discrete doped semiconducting or conducting regions have a cylindrical or a hyperbolic paraboloid shape;
further comprising a channel, wherein the continuous tunnel dielectric layer is located between the channel and the floating gate region, and a blocking dielectric located between the floating gate region and the control gate, and wherein the insulator comprises a portion of the blocking dielectric.

* * * * *